Figure 1:
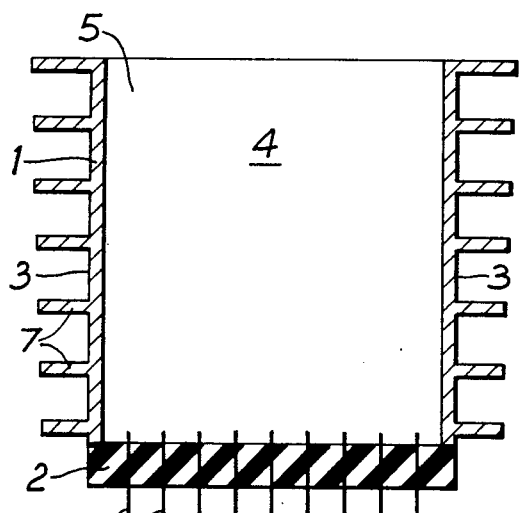

United States Patent [19]

Artus

[11] Patent Number: 4,764,845

[45] Date of Patent: Aug. 16, 1988

[54] COOLED COMPONENT ASSEMBLY

[76] Inventor: Raymonde G. C. Artus, The Cedars, 95 Crescent Road, Reading, Berkshire, England

[21] Appl. No.: 29,599

[22] Filed: Mar. 24, 1987

[30] Foreign Application Priority Data

Mar. 26, 1986 [GB] United Kingdom ................. 8607526

[51] Int. Cl.$^4$ ............................................. H05K 7/20
[52] U.S. Cl. .................................... 361/387; 361/388; 165/185
[58] Field of Search ............... 357/81, 82; 174/16 HS, 174/15 R, 52 PE, 17 SF; 165/185, 80.2, 80.3; 361/385–388, 383, 401, 412, 413, 414

[56] References Cited

U.S. PATENT DOCUMENTS

| | | | |
|---|---|---|---|
| 1,751,939 | 3/1930 | Meissner | 174/17 SF |
| 2,550,452 | 4/1951 | Byrne | 174/17 SF |
| 3,586,959 | 6/1971 | Eccles | 361/385 |
| 3,616,533 | 11/1971 | Heap | 361/385 |
| 3,828,848 | 8/1974 | Custers | 361/388 |
| 3,876,926 | 4/1975 | Schott | 361/387 |
| 4,299,715 | 11/1981 | Whitfield | 165/185 |
| 4,591,537 | 5/1986 | Aldinger | 361/387 |

FOREIGN PATENT DOCUMENTS 578869  7/1946  United Kingdom ........... 174/17 SF

Primary Examiner—G. P. Tolin
Attorney, Agent, or Firm—Finnegan, Henderson Farabow, Garrett & Dunner

[57] ABSTRACT

A component assembly is provided comprising a housing having connector means extending externally thereof, locating means mounted in the housing, a plurality of components located by said locating means, the components being connected to one another and to said external connector means, and a heat sink material comprising a particulate microcrystalline material such as diamond and a filler material such as a fluorocarbon or paraffin, said heat sink material filling said housing and being in heat transfer relation to said components.

9 Claims, 1 Drawing Sheet

U.S. Patent  Aug. 16, 1988  4,764,845

COOLED COMPONENT ASSEMBLY

Owing to the increasing complexity of electronic optical and electro-optical apparatus which is nowadays being required to do more complex operations and to do them faster, it has become necessary to reduce in size both the individual processing components and their spacing from each other in a given piece of apparatus in order to increase efficiency. In particular, with larger and more complex circuits being included in a single component, those of particular relevance currently being microchips and photo diodes, the error rate in producing said components becomes prohibitively high with regard to cost, and consequently manufacturers have sought different solutions to the problem of fitting ever more complex circuitry into ever smaller spaces.

One such solution is to employ a series of components of lesser complexity, hence lower failure rate from production faults; such components being arranged in arrays and interconnected with one another. However, these arrays of components have by necessity to be three dimensional arrays in most cases, and cooling of the components has been found to be a substantial problem. Furthermore, for ease and cheapness of replacement of the individual components, it is desirable that such a cooled array of components should allow easy replacement of a failed component so that a given array may be repaired and re-used.

According to the present invention there is provided a component assembly comprising a housing having connector means extending externally thereof, locating means mounted in said housing, a plurality of components located by said locating means, said components being connected to one another and to said external connector means, and a heat sink material filling said housing and in heat transfer relation to said components.

It will be appreciated the some or all of the components may be microchips which may be used in any sort of array, e.g., to form a macrochip, for example a logic array and/or a memory array and/or may be photo diodes, for example for converting optical signals to electric signals or vice versa. These again may be in any form of array desired. It will be further appreciated that this invention, although exemplified herein by preferred embodiments using electronic circuitry and components, is equally applicable for use with a plurality of heat producing components of any description which need to have heat removed therefrom at a high rate when in use. A further example, which in no way is intended to limit this invention, of a said component which may be used in an assembly according to the invention is a transformer e.g., for supplying alternating current to an array of electronic components housed in the assembly.

The housing is desirably used to conduct heat away from the heat sink material and to this end may be made of heat conducting material and may comprise heat dissipating means. Such heat dissipating means may comprise for example cooling fins and/or a liquid cooling jacket around the exterior of the housing. The housing may be sealed to protect the components and heat sink material therein, e.g., from dirt or moisture. Said housing may conveniently comprise a closure to allow introduction and removal of parts of the assembly. Preferably the housing will comprise a material of high thermal conductivity so as to enable maximum transfer of heat from the heat sink material through the housing to the outside thereof in order to assist dissipation of heat from the components. In order to assist the insertion and removal of parts of the assembly into and from the housing, the cross-sectional area of the housing may increase towards the opening.

The connector means may be in any form desired in order to interface with further components or equipment and may conveniently comprise pins or tags. For use with electronic equipment currently on the market a standard configuration of pins or tags may be adopted, for example the connector means may comprise a standard pin array for connection with a standard socket.

The components may be located in any desired configuration within the assembly by the locating means. The locating means may provide the connections between the components and the connector means in addition to locating the components within the assembly. The locating means may comprise at least one substrate of elecrically insulating material provided with component locator means to locate the individual components. The substrate may comprise suitable circuit means, e.g., may have a circuit printed or otherwise provided thereon, for making electrical connections between the components and/or between the components and the external connector means. Preferably the substrate comprises a multi-layer printed circuit. The component locator means may comprise apertures or recesses in the substrate adapted to receive and locate said components. Where the substrate comprises a multi-layer printed circuit it may have apertures or recesses therein for receiving components from opposite sides thereof. The components may be retained in said apertures or recesses by suitable retaining means such as a retaining plate or plates. Such retaining plate or plates may comprise suitable circuit means, e.g., printed or otherwise provided thereon, for making electrical connections between the different components and/or between components and the external connector means either in conjunction with or in place of the circuit means on said substrate. Said retaining means may be apertured or otherwise designed to enable the heat sink material to directly contact at least one surface of each component. Said components may each comprise at least one electrical terminal which extends outwardly therefrom and which makes electrical contact with said circuit means on said substrate and/or said retaining means, e.g., with a terminal pad of said circuit means. Preferably the at least one terminal of each component is clamped between the substrate and retaining means so as to be in electrical contact with said circuit means although it could, if desired, be soldered or otherwise electrically connected to the circuit means.

It will be appreciated that with locating means as aforesaid components can be arranged in a plurality of different layers to provide a three-dimensional array, the only limitation to the number and spacing of the components being the ability to make connections therebetween and provide adequate cooling thereof. It is envisaged that with a said heat sink material of sufficient thermal conductivity that a three dimensional array of the components may comprise several components in each dimension.

According to a preferred embodiment at least two sub-assemblies, each comprising locating means and components as aforesaid, are mounted in said housing in spaced relation to one another. The sub-assemblies may be spaced apart by suitable spacers therebetween and may be retained in required position in said housing by any suitable means such as suitable wedge means.

The heat sink material according to this invention may be capable of conducting heat from a number of closely packed components to the housing during use of the assembly to prevent the components from overheating e.g., such that failure or malfunction thereof occurs. Preferably the heat sink material comprises a mixture of particulate microcrystalline material, e.g., diamond, and a filler material, e.g., a fluorocarbon or paraffin. Preferably the heat sink material is in contact with one or more surfaces of each said component. In order to ensure that no voids occur in the heat sink material when the housing is filled therewith, it is preferred that the heat sink material be in the form of a paste or slurry and be introduced into the housing after the components and locating means have been assembled therein by centrifuging. The housing may then be sealed closed by means of a suitable closure as aforesaid.

The microcrystalline material is preferably diamond or cubic boron nitride, although other microcrystalline materials such as sapphire or silicon carbide or mixtures of any of the foregoing may also be used.

The particles of microcrystalline material are provided in a concentration suitable to provide a predetermined thermal conducting path, i.e. a path enabling heat to be rapidly removed from a critical area. In the case of micro-chips embedded in the heat sink, the micro-chips will be in thermal contact with the particle mixture so that heat generated in the chip is rapidly removed therefrom. Generally, chip temperatures should be kept below 300° C. and the heat sink material of the invention has been found ideally suitable to achieve this. Typically, the particle concentration will be in excess of 50%, and preferably in excess of 60%, by volume with a mean particle to particle distance of about $0.1\mu$ or less. The sizes of the particles is not critical so long as there are sufficient particles of $0.1\mu$ or less to provide the required mean particle to particle distance. Also, damage to the microchips due to vibration is minimized.

The filler material must be electrically non-conductive, have a high breakdown voltage, and should desirably have low shrinkage and thermal expansion, good flow characteristics, and be able to withstand temperatures of at least 300° C. It is also desirable that the filler material be degradable under certain conditions so that if it is desired to recover any chips or circuitry embedded in the heat sink this can be done.

Examples of suitable filler materials are flurocarbons and paraffins. These may be used either singly or as mixtures. Preferably the filler material is in liquid form so that when mixed with the particulate material a stiffish paste is obtained.

Figure 3:
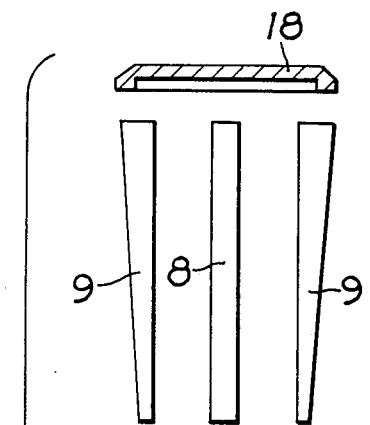
Figure 3:
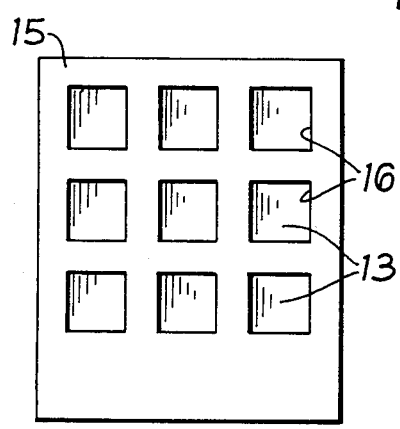
Figure 4:
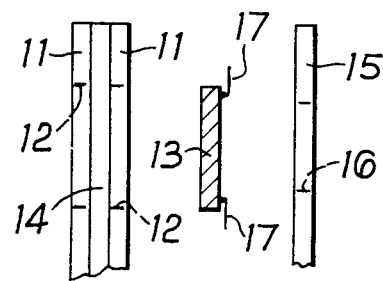
Figure 2:
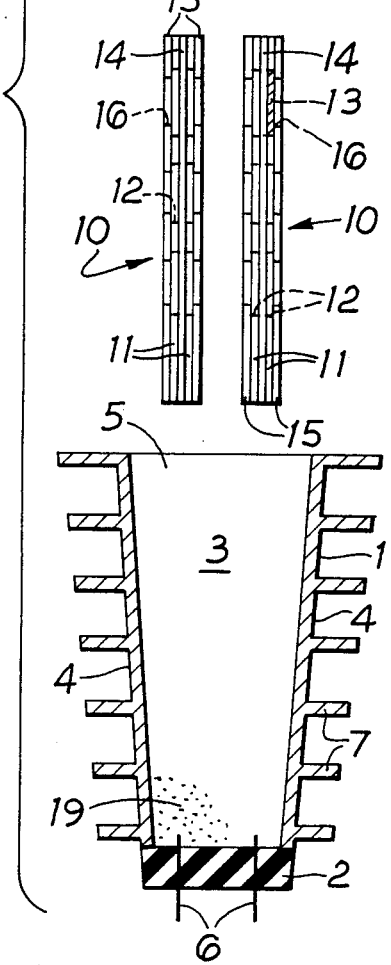

A preferred embodiment of the present invention will now be more particularly described with reference to the accompanying diagrammatic drawings in which:

FIG. 1 is a front sectional view of a housing of an assembly according to this invention, FIG. 2 is an exploded sectional view of the assembly of the present invention, FIG. 3 is a front elevation of a multi-layer printed circuit board sub-assembly of the assembly according to this invention, and FIG. 4 is a detail of part of the assembly of FIG. 2.

Referring to the drawings, the housing 1 comprises a bottom wall 2 of electrically insulating material, e.g., a suitable ceramics material, opposed end walls 3 and opposed side walls 4 which diverge from the bottom wall 2 to an open upper end 5. External connector means in the form of electrically conductive terminal pins 6 extend through the bottom wall 2 to the exterior of the housing 1. The housing 1 is formed from a suitable material having good thermal conductivity and the end walls 3 and side walls 4 have fins 7 on the exterior thereof which increase the surface area of the exterior of housing and so assist in dissipating heat therefrom.

Mounted within the housing 1 by means of spacers 8 and wedge members 9 are a pair of spaced sub-assemblies 10. Each sub-assembly 10 comprises two substrates 11 of electrically insulating material each of which has apertures 12 therein for the reception of microchips or other components 13 (only one of which is shown). The substrates 11 are spaced apart by a spacer plate 14 of electrically insulating material and the components 13 are retained in the apertures 12 of the substrates 11 by clamping plates 15 also of electrically insulating material. The clamping plates 15 have aperturs 16 therein which are smaller than the apertures 12 so that the components 13 cannot pass therethrough and which correspond with the apertures 12 so that a heat sink material (not shown) which fills the housing 1 around the sub-assemblies 10 can directly contact each of the components 13.

In the illustrated embodiment the components 13 are arranged in each substrate 11 in three rows of three so that each sub-assembly 10 contains eighteen components 13 in two different layers. It will be understood however, that each sub-assembly can comprise any desired number of components 13 in any desired arrangement and that as many sub-assemblies 10 as desired may be provided, the only criteria being that the heat generated by the components 13 can be absorbed by the heat sink material filling the housing 1 and dissipated by the housing 1 at a sufficient rate to prevent overheating of the components 13.

The components 13 of each sub-assembly 10, and if desired of both sub-assemblies 10, are electrically connected to one another and to the terminal pins 6. To this end each component 13 comprises electric terminals 17 which are clamped between the substrate 11 in which the component is received and its cooperating clamping plate 15. The substrates 11 and/or the clamping plates 15 have suitable electric circuits (not shown) printed or otherwise provided thereon with which the electric terminals 17 make contact and which, through suitable contact means (not shown) also make electrical contact with the terminal pins 6. Said electric circuits serve to electrically connect the components 13 to one another and to the terminal pins 6.

After the sub-assemblies 10 have been mounted in the housing 1 by means of spacers 8 and wedge members 9, the housing 1 is completely filled with a heat sink material 19 in the form of a paste or slurry of a particulate microcrystalline material, and a filler material. The housing 1 is preferably filled with the heat sink material by centrifuging or the like so as to ensure that there are no voids therein.

When the housing 1 has been filled with the heat sink material it is closed by a cover 18 which is preferably bonded, welded or otherwise sealingly secured to the housing 1 to prevent the ingress of dirt or moisture thereinto. The arrangement is preferably such that the cover 18 can subsequently be removed if desired for repair and replacement of a component 13 or a sub-assembly 10.

The particles of microcrystalline material in the heat sink material 19 are diamond particles although particles of other microcrystalline materials such as cubic boron nitride or sapphire may be used if desired. The filler material in the heat sink material 19 is a flurocarbon or paraffin although other suitable filler materials may be used if desired.

The heat sink material is in the form of a stiffish paste with a diamond particle concentration of at least 50%, and preferably at least 60%, by volume. The particle size distribution and the packing of the heat sink material into the cell 2 is such as to give a mean particle to particle distance of about $0.1\mu$ or less. Before being incorporated into the heat sink material the diamond particles were thoroughly cleaned of surface contamination by washing in acid, rinsing with ultra pure water and then baking in a furnace under vacuum.

EXAMPLE I

Diamond powder with a particle size distribution such that at approximately 65% volume fraction the mean particle to particle distance is about $0.1\mu$ was cleaned in acid, rinsed with ultra pure water to remove gross surface contamination and then baked in a furnace at about 500° C. and under vacuum of at least $1.10^{-6}$ Torr until all water had been driven off together with as much absorbed material as possible. The furnace temperature was then reduced to 120° C. and vapour of n-decane introduced into the vacuum. The vapour pressure was increased until the n-decane condensed. The powder was then removed to a closed container at 100° C. and a mixture of n-decane and 1.4 Mol % of fluorocarbon oil was added in sufficient quantity to wet the powder. The resulting mixture was then packed into a cell to approximately 65% volume fraction, particular care being taken to exclude all voids, and the cell sealed. The resulting mixture exhibited a thermal conductivity that was non-linear with temperature and which had a positive coefficient in that the thermal conductivity increased with increasing temperature.

The proportion of flurorocarbon oil to n-decane in the mixture which is added to the diamond powder can be varied according to the density of the diamond powder in the final mixture to provide optimum thermal conductivity and coefficient value, the correct proportion for any given density being readily determined by trial and error.

EXAMPLE II

A mixture A comprising 63% diamond particles and paraffin was prepared in a similar manner to that described in Example I. The mixture A was packed into a cell to substantially 63% volume fraction and the thermal conductivity in watts per metre kelvin (W/(m.K)) was measured at different temperatures across the cell (T). The results are shown in Table I.

TABLE I

| Mixture | T °C. | W/(m.K) |
|---|---|---|
| 63% diamond/paraffin | 16 | 1.37 |
|  | 20 | 1.40 |
|  | 34 | 1.43 |
|  | 39 | 1.49 |
|  | 43 | 1.53 |
|  | 48 | 1.56 |

Table I clearly demonstrates that the thermal conductivity was non-linear with temperature and had a positive coefficient.

EXAMPLE III

A mixture B comprising 58% diamond particles and fluorocarbon was prepared in a similar manner to that described in Example I. The mixture B was packed into a cell to substantially 58% volume fraction and the thermal conductivity in watts per metre Kelvin (W/(m.K)) was measured at different temperatures across the cell (T). The results are shown in Table II.

TABLE II

| MIXTURE B | T °C. | W/(m.K) |
|---|---|---|
| 58% diamond/fluorocarbon | 13.5 | 1.04 |
|  | 19 | 1.12 |
|  | 30 | 1.14 |
|  | 36 | 1.18 |
|  | 51 | 1.23 |
|  | 56.5 | 1.33 |
|  | 66 | 1.42 |
|  | 68 | 1.44 |
|  | 71 | 1.47 |
|  | 80 | 1.56 |

Table II clearly demonstrates that the thermal conductivity was non-linear with temperature and had a positive coefficient in that thermal conductivity increased with increasing temperature.

Whilst the mechanism of the heat sink material of the present invention is not fully understood it is believed that atoms of the filler material rebound between opposed surfaces of the closely packed diamond particles with increasing rapidity as the temperature increases with the result that the thermal conductivity of the mixture increases non-linearly with temperature and has a positive coefficient.

By increasing the density of the diamond powder in the mixture the value of the thermal conductivity at a given temperature can be increased as can the value of the coefficient. This can be seen from a comparison of Tables I and II.

Since contamination on the diamond powder particles reduces the value of the coefficient, the better the cleaning of the diamond particles the better the results will be.

I claim:

1. A component assembly comprising a housing, first electrical connector means extending through said housing to the exterior thereof, a substrate mounted in said housing, a plurality of apertures or recesses in said substrate which receive and locate electrical components, a retaining plate retaining said electrical components in said apertures or recesses, second electrical connector means electrically connecting said electrical components to one another and to said first electrical connector means and a heat sink material filling said housing, said retaining plate having apertures therein through which said heat sink material directly contacts said electrical components.

2. A component assembly according to claim 1, wherein said housing is formed from a heat conducting material and has cooling fins on the external surface thereof.

3. A component assembly according to claim 1, wherein said housing is a sealed housing having an opening therein closed by a closure and wherein the cross-sectional area of the housing increases towards the said opening.

4. A component assembly according to claim 1, wherein said substrate and said retaining plate are formed from electrically insulating material, with at least one of said substrate and said retaining plate comprising electric circuit means making electrical connections between said components and/or between said components and said external connector means.

5. A component assembly according to claim 4, wherein said components have outwardly extending electrical terminals thereon which are clamped between said substrate and said retaining plate and make electrical contact with said circuit means.

6. A component assembly according to claim 1, comprising at least one sub-assembly comprising at least two said substrates spaced apart by a spacer plate of electrically insulating material.

7. A component assembly according to claim 1, wherein said heat sink material comprises a paste or slurry of a particulate microcrystalline material and a filler material.

8. A component assembly according to claim 7, wherein said particulate microcrystalline material is selected from the group consisting of diamond, sapphire and cubic boron nitride and said filler material is selected from the group consisting of fluorocarbons and paraffins.

9. A component assembly according to claim 7, wherein the particle concentration in said heat sink material is in excess of 50% by volume with a mean particle to particle distance of about $0.1\mu$ or less.

* * * * *